United States Patent [19]

Mar

[11] Patent Number: 5,724,007
[45] Date of Patent: Mar. 3, 1998

[54] ADJUSTABLE LOCK DETECTOR FOR A PHASE-LOCKED LOOP CIRCUIT

[75] Inventor: Monte F. Mar, Issaquah, Wash.

[73] Assignee: Cypress Semiconductor Corporation, San Jose, Calif.

[21] Appl. No.: 622,539

[22] Filed: Mar. 25, 1996

[51] Int. Cl.$^6$ ................................................. H03L 7/095
[52] U.S. Cl. ........................ 331/1 A; 331/25; 331/DIG. 2
[58] Field of Search ........................ 331/1 A, 25, DIG. 2

[56] References Cited

U.S. PATENT DOCUMENTS

| | | | |
|---|---|---|---|
| 4,287,480 | 9/1981 | Swift et al. | 331/1 A |
| 5,008,635 | 4/1991 | Hanke et al. | 331/1 A |
| 5,126,690 | 6/1992 | Bui et al. | 331/1 A |
| 5,256,989 | 10/1993 | Parker et al. | 331/1 A |
| 5,525,932 | 6/1996 | Kelkar et al. | 331/DIG. 2 |

OTHER PUBLICATIONS

Shariatdoust et al. (AT&T Bell Laboratories), IEEE 1992 Custom Integrated Circuits Conference, pp. 24.2.1–24.2.5, no month.
Alvarez et al., 1994 Symposium on VLSI Circuits Digest of Technical Papers, pp. 37–38, IEEE Apr. 1994.

Primary Examiner—Siegfried H. Grimm
Attorney, Agent, or Firm—Dykema Gossett PLLC

[57] ABSTRACT

A lock detector suitable for detecting when an output signal of a phase-locked loop circuit is phase-locked to an input reference signal. The lock detector includes a pair of delay lines, that are adjustable, which are used to create a window signal around the reference clock signal. UP and DOWN signals from the PLL circuit are fed to an OR gate to generate an actual out-of-lock signal. When the PLL circuit is phase-locked within an acceptable phase error range, the UP, and DOWN signals, if any, will appear within the generated window signal. When the PLL circuit is not phase-locked within the acceptable phase error range, the UP, and DOWN signals occur outside of the window. The window signal, and the output of the OR gate are connected to an AND gate to generate a gated out-of-lock signal. The gated out-of-lock signal is connected to a switched-capacitor charge pump. So long as the switched-capacitor charge pump does not receive an active gated out-of-lock signal, the charge pump will, after a predetermined number of input clock signals, generate a logical lock signal, indicating that the PLL circuit has reached steady-state phase-lock. However, when the switched-capacitor charge pump receives an activated gated out-of-lock signal, the charge pump will deassert the logical lock signal.

20 Claims, 3 Drawing Sheets

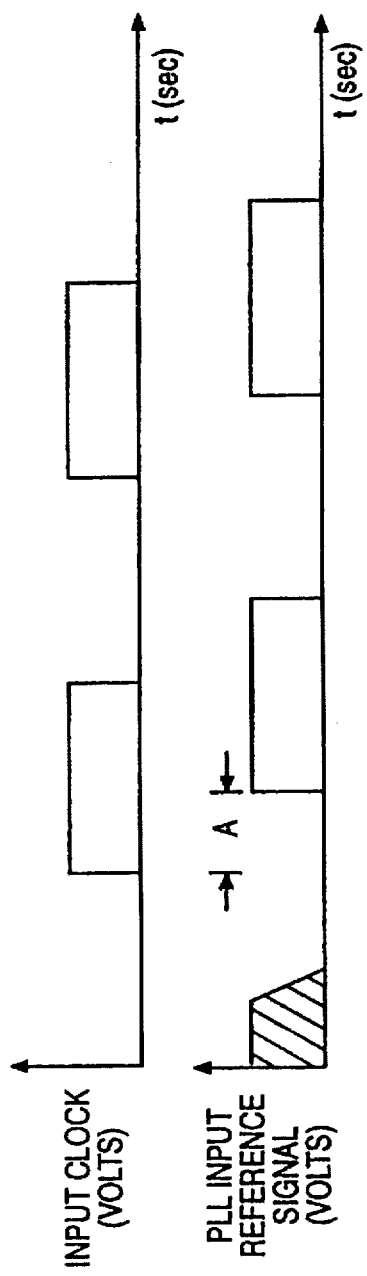
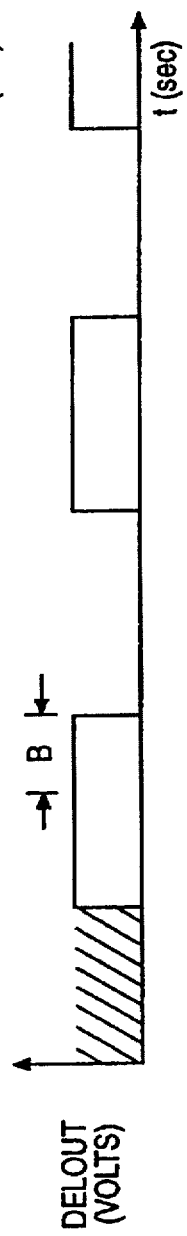
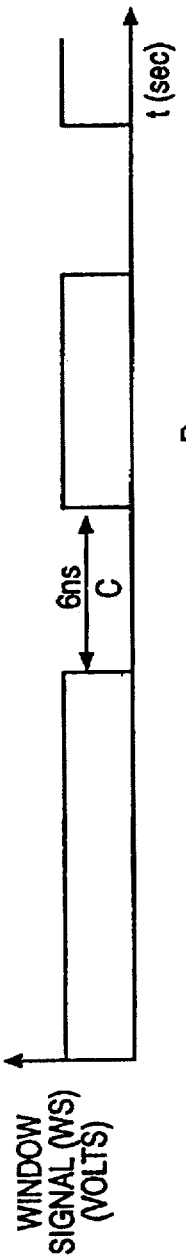
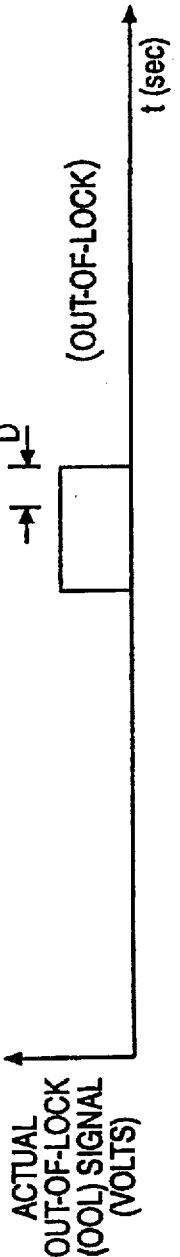
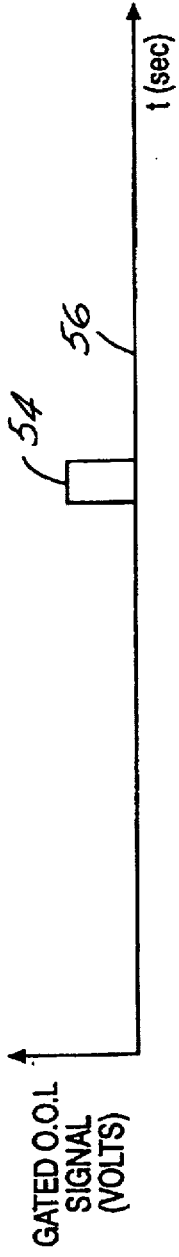

ADJUSTABLE LOCK DETECTOR FOR A PHASE-LOCKED LOOP CIRCUIT

BACKGROUND OF THE INVENTION

1. Field of the Invention

The present invention relates to phase-locked loop circuitry, and, more particularly, to an adjustable lock detector for detecting when an output signal of the phase-locked loop circuit is phase-locked to an input reference signal to the PLL circuit.

2. Related Art

Phase-locked loop (PLL) circuits are very important, and are used in many applications, such as clock synthesizers, communication circuits, and frequency synchronization. In such applications, the PLL circuit is used to provide an output signal that is phase-locked to an input reference signal. That is, the output signal is of the same frequency, and phase as the input reference signal. The basic PLL circuit includes three parts: a phase/frequency detector (PFD), a loop filter, usually a low-pass filter, and a voltage-controlled oscillator (VCO). It should be appreciated that a phase detector is an essential part of the PLL; the PFD being a specialized case of a phase detector.

In a common-configuration, a charge pump is also used. This basic setup is conventional, and is well-known to one of ordinary skill in the art.

The PFD is responsive to two signals: the PLL input reference signal, and the VCO output signal fed back to the PFD (sometimes divided by a divider, or the like) (hereinafter the "feedback signal"). When the feedback signal is substantially the same frequency, and phase as the PLL input reference signal, then the PLL circuit is said to be phase-locked. In this condition, the two outputs of the PFD, namely, an UP, and a DOWN signal both assume a first state indicative of this condition, which may be a logic low state. These signals are used to control the charge pump to increase or decrease its output control voltage. However, if the input signal occurs before the feedback signal, indicating that the VCO is running too slow, the PFD produces the pump UP signal (UP) that continues until the rising edge of the feedback signal. Thus, the UP signal is characterized by a pulse width indicative of the phase difference between the input reference signal, and the feedback signal. On the other hand, if the feedback signal to the PFD occurs before the input reference signal, the PFD produces a pump DOWN signal that is triggered on the rising edge of the feedback input, and continues until the rising edge of the PLL input reference signal. The DOWN pulse therefore, is also characterized by a pulse width that is indicative of the phase difference between the input reference signal, and the feedback signal. By way of the foregoing method, the PFD forces the VCO to run faster or slower based on the relationship between the two inputs thereto; namely, the PLL input reference signal, and the feedback signal.

The PLL circuit is further characterized by an overall transfer function; accordingly, before the VCO output locks to the PLL input, a startup interval occurs wherein the feedback signal oscillates about the input reference signal (i.e., undershoots, and overshoots the input reference signal) before a steady state, phase-locked condition is achieved. Based on the foregoing, it should be appreciated that what may appear to be a phase-locked condition, based on the absence of pulses on either the UP or DOWN output terminals of the PFD, is, in actuality, merely a transitory phase-locked condition, which, although perhaps lasting several clock cycles, is not a steady-state phase-lock.

Further, once locked in steady state, minor drifts literally generate pulses; however, the loss-of-lock is so minor that it is desirable to ignore it. There is thus the need to provide a phase-locked loop lock detector to determine when steady-state phase-lock has been achieved by the PLL circuit, and which has immunity to minor drift without discontinuing the logical lock signal. For example, output circuitry of a device may be disabled until a phase-locked condition has been acquired, or, further, a valid clock signal may require a lock signal to be generated.

One approach taken in the art has been to use pulse discriminators to determine when UP, or DOWN pulses of greater than a predetermined pulse width are being generated. A free running digital counter is also provided in such an approach. Every time the pulse discriminators indicate that wide UP/DOWN pulses have been detected (i.e., indicating that a "near phase-lock" condition has been lost), the digital counter is reset, and the counting process must be restarted. However, if the pulse discriminators do not indicate that wide UP/DOWN pulses have been generated before the digital counter counts a preselected number of cycles, the output of the digital counter changes state, which is in turn operative to generate a logical lock signal indicating that a steady state phase-lock has been obtained.

Another approach taken in the art is to employ a resistor/capacitor (RC) filter responsive to each of the UP and DOWN pulse trains. The respective filters provide a zero pulse output when the phase-locked loop circuit is near phase-lock but provides a non-zero output otherwise. Such an RC filter arrangement is coupled to a corresponding RC charging circuit that is discharged whenever the filtered pulses are non-zero, indicating that the PLL circuit is not locked.

One disadvantage to both of the above-mentioned approaches taken in the art is that each require a large silicon area to implement. In particular, a digital counter is relatively large, as is the RC charging circuit.

Furthermore, with respect to the RC filter approach, such filters are not easily implemented with any reasonable degree of accuracy. In particular, over typical fabrication process variation, the time constant of such RC filter can vary between 10–20%; accordingly, such variance also directly affects the ability of the lock detector to detect a steady-state phase-locked condition.

Furthermore, adjustability of the lock window (i.e., adjustment of the acceptable phase error) is impractical with the above-identified RC filter approach, as well as with the pulse discriminator approach.

Accordingly, there is a need to provide an improved PLL lock detector suitable for use with a PLL circuit that minimizes or eliminates one or more of the problems as set forth above.

SUMMARY OF THE INVENTION

This invention provides an adjustable PLL lock detector circuit of the type suitable for use in connection with a phase-locked loop (PLL) circuit. One object of the present invention is to provide a lock detector that permits adjusting the amount of acceptable phase error in determining whether the output reference frequency is phase-locked with respect to the input reference signal. To achieve this and other objects, the present invention provides an adjustable phase error window, which, when an actual out-of-lock indicative signal from the phase-locked loop circuit (e.g., the UP/DOWN signals in a preferred, charge-pump based PLL embodiment) occurs outside of the window, a no-lock state can be determined.

An apparatus in accordance with this invention includes three main parts: means for generating a window signal, means for detecting when an actual out-of-lock signal occurs outside of the window and generating in response thereto a gated out-of-lock signal in an active state, and, means for generating a logical lock signal when no gated out-of-lock signal has been generated for a predetermined number of input clock cycles, thus indicating that a steady-state phase-locked condition has been achieved. The window signal has a pulse width indicative of a predetermined phase error to thereby define an acceptable phase error window. The detecting and generating means is otherwise operative to generate the gated out-of-lock signal in a second, inactive state. The inactive gated out-of-lock signal indicates that the phase-locked loop circuit is phase-locked to within the predetermined phase error level. Preferably, two programmable delay lines are used to generate the window signal using an input clock. The PLL input reference signal is tapped off the first delay line, while the output of the second delay line defines a late clock. The early (input) and late clocks are combined to form the window. By adjusting the size of the delay lines, the UP and DOWN signals will be centered in the acceptable phase error window when the PLL circuit is locked. If the UP and DOWN signals have activity outside of the window, the PLL circuit is not phase-locked, and the logical lock signal will not be generated.

The means for detecting when the gated out-of-lock signal has been inactive for a predetermined number of input clock cycles preferably takes the form of a switched-capacitor charge pump. The switched-capacitor circuit includes a first capacitor, which is charged up to the positive power supply bus during a first state of the input clock. A second capacitor is connected to an output node. During the second state of the input clock, charge is shared between the first, and second capacitors by way of a second switch. When the gated out-of-lock signal is inactive, the second capacitor will be progressively charged with each cycle of the input clock until a logic high state is generated on the output node, indicative of a steady-state phase-lock condition. However, when the gated out-of-lock signal is active, a third switch, connected in parallel with the second capacitor, is placed in a conductive state to thereby selectively discharge the second capacitor, preventing a logical lock signal from being generated on the output node. The switched-capacitor arrangement can be made much smaller (i.e., consumes less silicon die area) than either of the counter or RC charging circuit approaches. Furthermore, the adjustability of the delay lines for generating the window signal can be well controlled, so lock can be determined more reliably with much improved accuracy. The programmability of the delay lines allows different resolutions for discriminating frequency lock. Programmable bits for adjusting the amount of delay introduced by the delay lines can be driven using an erasable programmable read only memory (EPROM).

These and other features and objects of this invention will become apparent to one skilled in the art from the following detailed description and the accompanying drawings illustrating features of this invention by way of example.

BRIEF DESCRIPTION OF THE DRAWINGS

FIGS. 3A–3F are simplified, timing diagram views illustrating the relative transitions of the signals at various nodes in the circuit illustrated in FIG. 2.

DETAILED DESCRIPTION OF THE PREFERRED EMBODIMENTS

Figure 1:
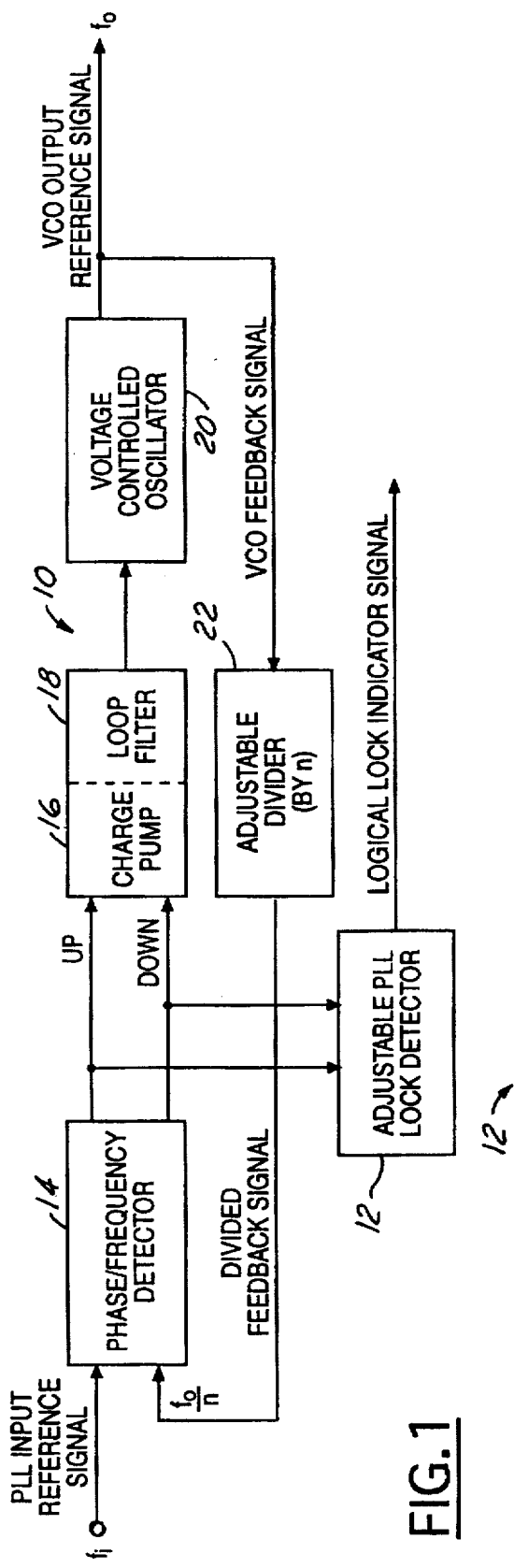
FIG. 1 is a simplified block diagram view of a preferred environment in which the inventive adjustable PLL lock detector may be employed.

Referring now to the drawings wherein like reference numerals are used to identify identical components in the various views, FIG. 1 shows a phase-locked loop (PLL) circuit 10 connected to an adjustable PLL lock detector 12 in accordance with the present invention. PLL circuit 10 includes a phase/frequency detector (PFD) 14, a charge pump 16, a loop filter 18, a voltage controlled oscillator (VCO) 20, and, optionally, an adjustable divider 22.

Phase/frequency detector (PFD) 14 is conventional in the art, and is responsive to a PLL input reference signal, $f_i$, and a VCO output $f_o$, shown in FIG. 1 divided by n: $f_o/n$ (hereinafter the "feedback signal"). As discussed in the Background section, PFD 14 is provided for generating at least one, and preferably a plurality of out-of-lock indicative signals corresponding to whether, and to what extent, the feedback signal is phase-locked (or out-of-lock) with the input reference signal. In the illustrated embodiment, the out-of-lock indicative signals are the well-known UP, and DOWN signals.

Charge pump 16 is responsive to the UP, and DOWN signals and is provided for generating a control signal whose voltage potential corresponds to a phase error between the feedback signal, and the input reference signal, as indicated by the UP and DOWN signals. Charge pump 16 is conventional in the art, and may take any one of the plurality of well-known forms.

Loop filter 18 is coupled to charge pump 16 and is provided for amplifying, and shaping, the transfer characteristic of the generated control signal. The loop filter 18 generally may take the form of a low-pass filter, and outputs a modified control signal having a voltage potential corresponding to the above-mentioned phase error.

Oscillator 20, which may be a voltage controlled oscillator 20, is controlled in accordance with the modified control signal generated by loop filter 18, and is operative to generate the output reference signal, illustrated in FIG. 1 as the VCO output reference signal $f_o$. VCO 20 is conventional in the art, and may take any one of the plurality of forms well-known in the art.

Adjustable divider 22 is optionally included in the PLL circuit 10. Divider 22 may be a simple counter, and is included in PLL 10 to increase the frequency of the output reference signal $f_o$ in accordance with design principles known to one of ordinary skill in the art.

Lock detector 12 is responsive to the out-of-lock indicative signals, the UP, and DOWN signals, for generating a logical lock signal, which, when active, corresponds to a steady-state lock condition of PLL circuit 10. The uses of the logical lock indicator are many, and are limited only by the ingenuity of those practicing in the art. For example, the logical lock indicator signal may be used to generate a clock valid signal (e.g., a clock valid signal would not be generated unless, and until the logical lock indicator signal is asserted). In addition, adjustable PLL lock detector 12 may be profitably employed in providing a fast power-on function for a slewing part, as disclosed and claimed in my co-pending U.S. application Ser. No. 08/622,531 entitled "APPARATUS FOR FAST PLL FREQUENCY SLEWING DURING POWER-ON," filed Mar. 25, 1996, and assigned to the common assignee of the present invention, hereby incorporated by reference.

Figure 2:
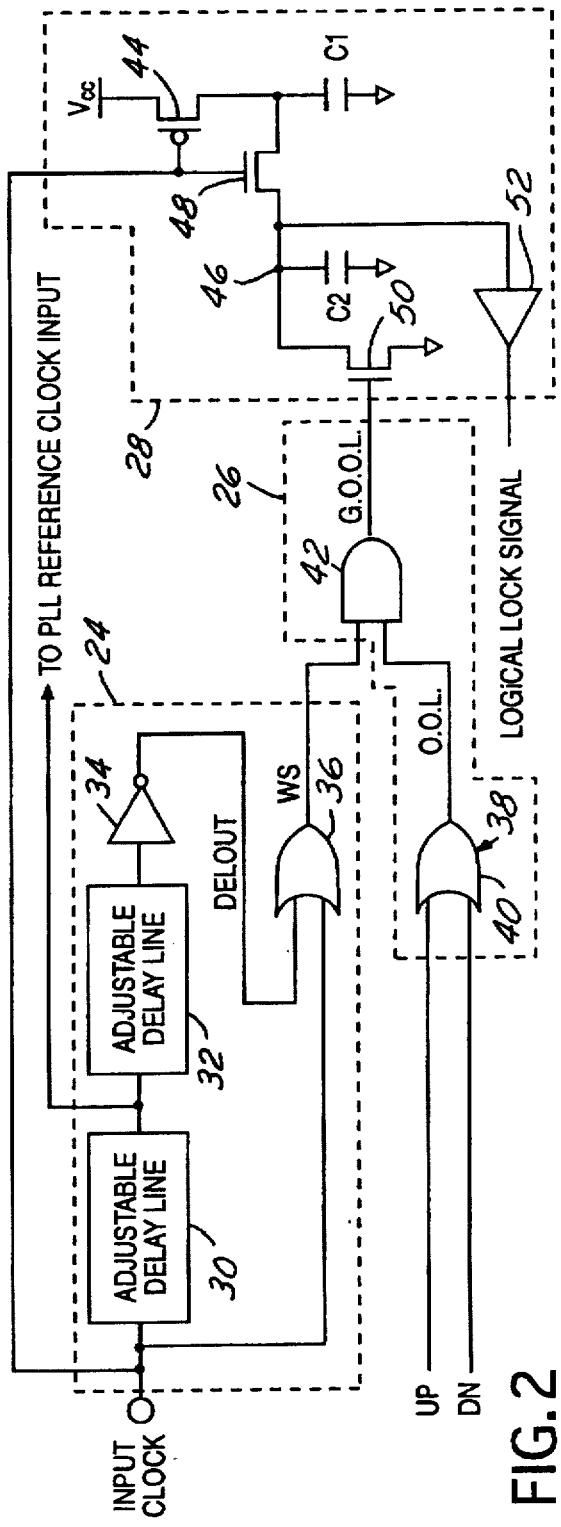
FIG. 2 is a simplified, schematic and block diagram view showing, in greater detail, the lock detector illustrated in FIG. 1.

Referring now to FIG. 2, lock detector 12 is shown in greater detail. Lock detector 12 includes means, such as window signal generator 24, for generating a window signal WS, means or circuit 26 for detecting when an actual out-of-lock signal occurs outside of an acceptable phase error window, and means, such as switched capacitor circuit 28 for generating a logical lock signal.

Window signal generator 24 is responsive to an input clock for generating the window signal (WS). The window signal WS has a pulse width representative of, or, in other words, corresponding to a predetermined, acceptable phase error. The window signal WS is thus a pulse which defines an acceptable phase error window. The window signal generator 24 includes a first adjustable delay line 30, a second adjustable delay line 32, and inverter 34, and an OR gate 36. Delay lines 30, and 32 introduce first, and second amounts of delay, respectively, into the signal path of which they are a part. The first and second amounts of delay are adjustable. Structures for performing this delay function, adjustably, are conventional, and well-known in the art. In one embodiment, the amount of delay introduced by each delay line is controlled by programmable bits stored in an erasable programmable read only memory (EPROM).

Referring now to FIGS. 3A–3E, FIG. 3A illustrates the input clock, prior to entering delay line 30. FIG. 3B illustrates the input clock, as it emerges from delay line 30, which is shown as being delayed by an amount indicated at A. The PLL input reference signal, which is provided as an input to PFD 14, is generated by delay line 30.

FIG. 3C illustrates a delay out (DELOUT) signal (late clock) as it emerges from inverter 34. Note that delay line 32 has introduced a second amount of delay, indicated at B. Thus, the input clock (FIG. 3A) is advanced relative to the PLL input reference signal, but the DELOUT signal (FIG. 3C) is retarded, and inverted, relative to the PLL input reference signal. As shown in FIG. 2, OR gate 36 generates the window signal WS using the input clock, and the DELOUT signal. As shown in FIG. 3D, the window signal WS has a selected pulse width of C. The amount of delay introduced by delay lines 30, 32 is selected such that the window signal WS defines an acceptable phase error window. That is, by adjusting the size of the delay lines 30, and 32, and, accounting for the delay through PFD 14, UP, and DOWN signals within an acceptable phase error will fall within the window pulse when the PLL circuit 10 is to be considered logically phase-locked. Varying the amount of delay introduced by delay lines 30, and 32 therefore varies the predetermined, acceptable amount of phase error. Accordingly, stated another way, the size of the pulse of the window signal WS corresponds to the acceptable phase error.

Referring to FIG. 2 circuit 26 uses the UP, and DOWN signals, generated by PLL circuit 10, to generate an active gated out-of-lock (GOOL) signal when the actual out-of-lock (OOL) signal occurs outside of the acceptable phase error window. Circuit 26 is further operative for otherwise generating an inactive gated out-of-lock signal indicative of a condition wherein PLL circuit 10 is phase-locked to within the predetermined phase error level, as defined by the acceptable phase error window (shown in FIG. 3D). Circuit 26 includes an actual out-of-lock detector for generating an actual out-of-lock (OOL) signal, which may take the form of OR gate 40, and a gating circuit, such as AND gate 42, for generating the gated out-of-lock signal GOOL. It should be appreciated that the gates illustrated in FIG. 2 are exemplary only and not limiting in nature; other variations performing the same or similar logical functions (e.g., by application of DeMorgan's Theorem) are within the spirit and scope of this invention.

The actual out-of-lock signal OOL is representative of whether, and to what extent, the output reference signal of the PLL circuit 10 is phase-locked with respect to the input reference signal. That is, whenever the output of PLL circuit 10 is not precisely phase-locked with the input, the gate 40 will generate the actual out-of-lock signal, notwithstanding the fact that the amount by which the PLL circuit is out-of-lock may be actually within the acceptable phase error range.

AND gate 42 generates an active gated out-of-lock signal when the OOL signal occurs outside of the acceptable phase error window. Otherwise, gate 42 generates an inactive signal, which, as indicated above, is indicative of a condition wherein PLL circuit 10 is phase-locked within the predetermined phase error range.

Referring now to FIG. 3E, the operation of circuit 26 is more clearly illustrated graphically. FIG. 3E shows the out-of-lock (OOL) signal occurring outside of the acceptable phase error window signal WS by an amount indicated at D. Gate 42 uses the window to define the acceptable phase error before indicating a no lock condition (i.e., an active GOOL signal).

Referring to FIG. 2, switched capacitor circuit 28 provides the means for determining when the gated out-of-lock signal has been inactive (e.g., the low state 56 in FIG. 3F) for a predetermined number of input clock cycles, and, in response thereto, generating the logical lock signal. Circuit 28 includes a first capacitor C1, a first switch, such as PMOS field effect transistor (FET) 44, second capacitor C2, output node 46, second switch, such as NMOS field effect transistor (FET) 48, third switch, such as NMOS FET 50, and buffer 52.

Switch 44 is provided for charging capacitor C1 during a first state, which in one embodiment is a logic low state, of the input clock. During this low (off) state of the input clock cycle, capacitor C1 is charged towards the potential of a positive power supply bus $V_{cc}$. Second switch 48, when the input clock goes high, (i.e., the second state) connects capacitor C1 to output node 46 to thereby permit charging between capacitors C1, and C2. Third switch 50 is connected in parallel with capacitor C2 and is provided for selectively discharging the output node 46 when the gated out-of-lock signal is active.

To more fully appreciate the operation of circuit 28, it should be noted that the capacitance associated with capacitor C2 is much greater than the capacitance associated with capacitor C1.

For example, in a constructed embodiment, the value of C1 is approximately 10 femtofarads ($10 \times 10^{-15}$), while the value of C2 is approximately 6 picofarads (pf) ($6 \times 10^{-12}$). Thus, while the gated out-of-lock signal is inactive, each input clock cycle serves to charge C2 to a progressively higher voltage potential. When the voltage potential observed at output node 46 reaches a trip point associated with buffer 52, the logical lock signal will be asserted. The number of cycles required to charge C2 to the buffer 52 trip point is a function of the capacitance of C1, the capacitance of C2, and the trip point level of buffer 52. The particular selection of the values, and trip point level of the aforementioned components will vary depending upon the particular needs of the circuit (e.g., will depend upon the determination of what constitutes a "steady-state" lock condition). In one embodiment, the buffer 52 generates the logical lock signal after approximately 160 clock cycles.

When the gated out-of-lock signal is active (as shown in FIG. 3E), FET 50 will be placed in a conductive state, thereby effectively discharging capacitor C2 to the potential of a negative power supply bus $V_{ss}$. The degree to which C2 is discharged by way of FET 50 will depend, among other things, upon both the duration (i.e., pulsewidth), and frequency of occurrence of the gated out-of-lock signal, which in turn, depends upon the extent to which the UP/DOWN signals from PLL circuit 10 deviate, or appear outside of the acceptable phase error window WS.

In another embodiment, buffer 52 comprises a pair of inverter circuits connected in a series arrangement. As is well-known to one of ordinary skill in the art, the trip point of an inverter depends, in part, upon the relative sizes (i.e., strength) of the ubiquitous pull-up PMOS relative to the pull-down NMOS. It should be appreciated to one of ordinary skill in the art that the trip point of buffer 52, and thus also the predetermined number input clock cycles required for generating the logical lock signal, can be adjusted, or varied as a function of the size of the inverter circuits employed to construct buffer 52.

Thus, adjustable delay lines 30, and 32 can be dynamically varied to create an adjustable window around the PLL input reference signal. The window so generated can be well controlled, so that a steady-state lock can be determined with improved accuracy, and reliability. Adjustability of the delay lines 30, and 32 permit different resolutions for discriminating frequency lock. The use of a switched capacitor circuit charge pump preserves precious silicon die area over conventional approaches that employ either a counter, or an RC charging circuit.

It should be understood from the foregoing, and in particular FIG. 1, that a phase-locked loop circuit that includes the inventive adjustable PLL lock detector 12 is within the spirit and scope of the present invention.

Figure 4:
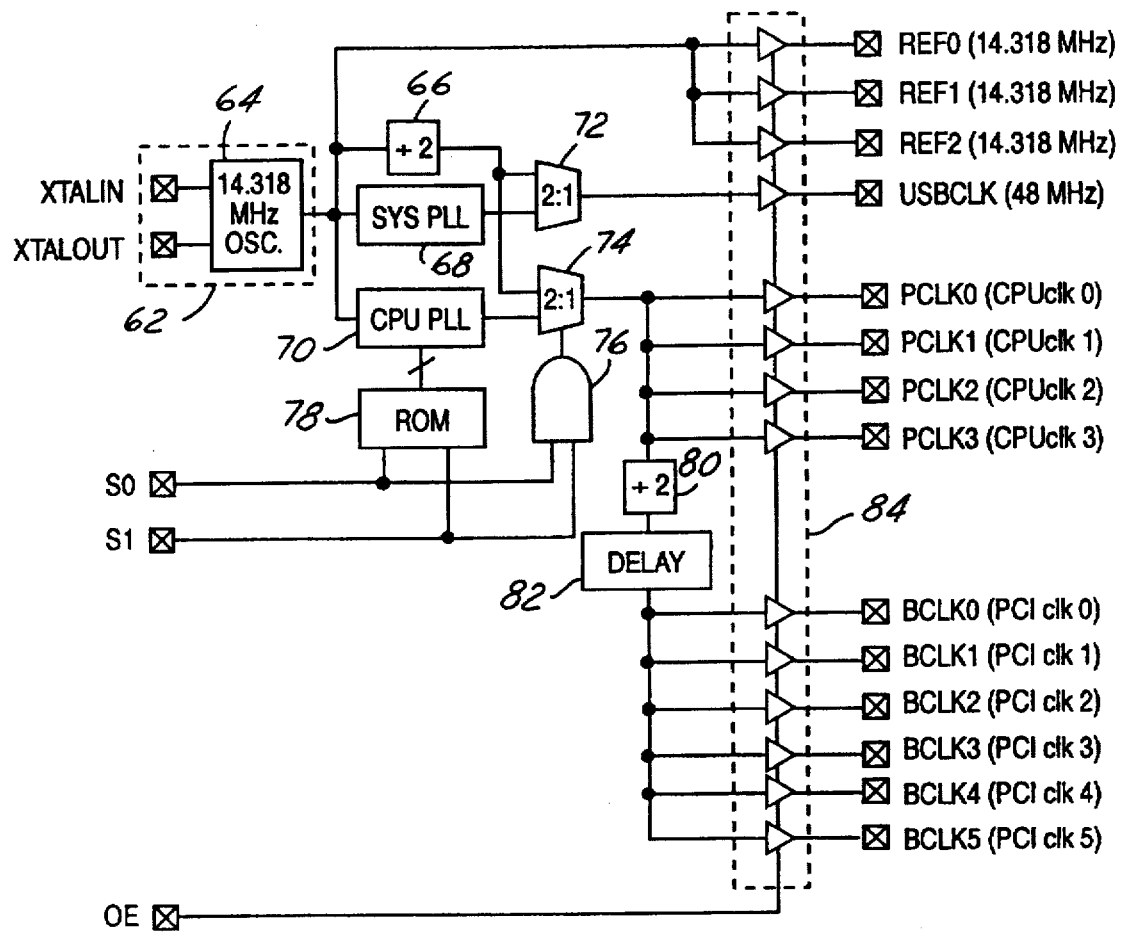
FIG. 4 is a simplified, combined schematic and block diagram view of a clock synthesizer circuit incorporating a phase-locked loop circuit having an adjustable PLL lock detector in accordance with the present invention.

Referring now to FIG. 4, it should be further understood that a PLL circuit such as referred to above (i.e., that includes the inventive adjustable PLL lock detector 12) can be employed in yet larger systems and remain within the present invention. FIG. 4 shows a clock synthesizer 60 which provides a variety of output clock signals based on an input clock signal, and other control signals. Clock synthesizer 60 includes an input reference signal generator 62, comprising an oscillator 64, a divider, such as divide-by-two block 66, a system PLL circuit 68, a CPU PLL circuit 70, a first selector, such as two-to-one selector 72, a second selector, such as two-to-one selector 74, AND gate 76, read only memory (ROM) 78, divider, such as divide-by-two block 80, delay block 82, and output enable (OE) buffers 84. PLL circuits 68, and 70 may be constructed using the inventive PLL 10 and lock detector 12, as shown in FIG. 1. The logical lock signal generated therein (not shown in FIG. 4) may be used to generate a valid clock signal. ROM 78, based on selection bits S0, and S1, may be effective to provide programmable bits to adjustable delay lines 30, and 32 (contained in blocks 68 and 70) to thereby change the acceptable phase error window size. Components 66, 72, 74, 76, in response to selection bits S0, and S1, are operative to select for output on the indicated output ports either the PLL outputs, or the direct (divided-by-two) oscillator output. The output enable (OE) signal is operative to enable output enable buffers 84 to pass various clock signals to their respective output ports. Components 80, and 82 provide for a reduced frequency, and delayed signal, as may be required by modern personal computer bus architectures. Applicant hereby incorporates by reference published document entitled "Clock Synthesizer/Driver for Pentium™ and Pentium Pro™ Processors", November 1995, available from the assignee of the present invention.

While the invention has been particularly shown and described with reference to the preferred embodiments thereof, it is well understood by those skilled in the art that various changes and modifications can be made in the invention without departing from the spirit and scope of the invention.

I claim:

1. An apparatus for detecting when an output signal of a phase-locked loop circuit is phase locked to an input reference signal to the phase-locked loop circuit, comprising:

means for generating a window signal having a pulse width indicative of a predetermined phase error to thereby define an acceptable phase error window including means for varying said predetermined phase error to thereby adjust the size of said acceptable phase error window;

means coupled to the phase-locked loop circuit for detecting when an actual out-of-lock signal occurs outside of said acceptable phase error window and generating in response thereto a gated out-of-lock signal in a first state, said detecting and generating means being otherwise operative to generate said gated out-of-lock signal in a second state indicative of a condition wherein said phase-locked loop circuit is phase locked within said predetermined phase error; and means for detecting when said gated out-of-lock signal has been in said second state for a predetermined number of input clock cycles and generating in response thereto a logical lock signal, said input clock corresponding to said input reference signal.

2. The apparatus of claim 1 wherein said window signal generating means includes a first delay line coupled to said input clock for generating said input reference signal wherein said input clock is advanced relative to said input reference signal, a second delay line coupled to said input reference signal for generating an output clock wherein said output clock is retarded relative to said input reference signal, and an OR gate responsive to said input clock and said output clock for generating said window signal.

3. The apparatus of claim 2 wherein said first delay line introduces a first amount of delay, said second delay line introduces a second amount of delay, said first and second amounts of delay being adjustable to thereby vary said predetermined phase error.

4. The apparatus of claim 2 wherein said detecting and generating means includes an AND gate responsive to said window signal and said actual out-of-lock signal for generating said gated out-of-lock signal.

5. The apparatus of claim 2 wherein said means for generating said logical lock signal comprises:

a first capacitor;

a first switch responsive to said input clock for charging said first capacitor during a first state of said input clock;

a second capacitor connected between an output node and a negative power supply bus;

a second switch responsive to said input clock for connecting said first capacitor to said output node during a second state of said input clock to thereby permit charging of said second capacitor;

a third switch connected in parallel with said second capacitor for selectively discharging said second capacitor when said gated out-of-lock signal is in said first state; and, a buffer coupled to said output node for generating said logical lock signal.

6. The apparatus of claim 1 wherein said means for generating said logical lock signal comprises:

a first capacitor;

a first switch responsive to said input clock for charging said first capacitor during a first state of said input clock;

a second capacitor connected between an output node and a negative power supply bus;

a second switch responsive to said input clock for connecting said first capacitor to said output node during a second state of said input clock to thereby permit charging of said second capacitor;

a third switch connected in parallel with said second capacitor for selectively discharging said second capacitor when said gated out-of-lock signal is in said first state; and, a buffer coupled to said output node for generating said logical lock signal.

7. The apparatus of claim 6 wherein said first capacitor has a first capacitance, and said second capacitor has a second capacitance, said predetermined number of input clock cycles being determined as a function of said first and second capacitance values.

8. The apparatus of claim 7 wherein said buffer comprises a pair of inverter circuits connected in a series arrangement wherein a trip point of said buffer is defined as a function of a size of the respective inverter circuits, said predetermined number of input clock cycles required for generating said logical lock signal being further defined as a function of said buffer trip point.

9. An apparatus for detecting when an output signal of a phase-locked loop circuit is phase locked to an input reference signal to the phase-locked loop circuit, comprising:

means for generating a window signal having a pulse width indicative of a predetermined phase error to thereby define an acceptable phase error window;

means coupled to the phase-locked loop circuit for detecting when an actual out-of-lock signal occurs outside of said acceptable phase error window and generating in response thereto a gated out-of-lock signal in a first state, said detecting and generating means being otherwise operative to generate said gated out-of-lock signal in a second state indicative of a condition wherein said phase-locked loop circuit is phase locked within said predetermined phase error, said detecting and generating means including an AND gate responsive to said window signal and said actual out-of-lock signal for generating said gated out-of-lock signal; and means for detecting when said gated out-of-lock signal has been in said second state for a predetermined number of input clock cycles and generating in response thereto a logical lock signal, said input clock corresponding to said input reference signal.

10. The apparatus of claim 9 wherein said detecting and generating means further includes an OR gate responsive to UP and DOWN signals generated by the phase-locked loop circuit for generating said actual out-of-lock signal, said UP signal corresponding to a state wherein the phase-locked loop output signal lags the input reference signal, said DOWN signal corresponding to another state wherein the phase-locked loop output signal leads the input reference signal.

11. The apparatus of claim 9 wherein said window signal generating means includes a first delay line coupled to said input clock for generating said input reference signal wherein said input clock is advanced relative to said input reference signal, a second delay line coupled to said input reference signal for generating an output clock wherein said output clock is retarded relative to said input reference signal, and an OR gate responsive to said input clock and said output clock for generating said window signal.

12. The apparatus of claim 11 wherein said means for generating said logical lock signal comprises:

a first capacitor;

a first switch responsive to said input clock for charging said first capacitor during a first state of said input clock;

a second capacitor connected between an output node and a negative power supply bus;

a second switch responsive to said input clock for connecting said first capacitor to said output node during a second state of said input clock to thereby permit charging of said second capacitor;

a third switch connected in parallel with said second capacitor for selectively discharging said second capacitor when said gated out-of-lock signal is in said first state; and, a buffer coupled to said output node for generating said logical lock signal.

13. An apparatus for detecting when an output signal of a phase-locked loop circuit is phase locked to an input reference signal to the phase-locked loop circuit, comprising:

a window signal generator responsive to an input clock for generating a window signal having a pulsewidth indicative of a predetermined phase error to thereby define an acceptable phase error window;

an out-of-lock detector coupled to the phase-locked loop circuit for generating an actual out-of-lock signal representative of whether the output signal of the phase-locked loop circuit is locked with respect to the input reference signal;

a gating circuit responsive to said actual out-of-lock signal for detecting when said actual out-of-lock signal occurs outside of said acceptable phase error window and generating in response thereto a gated out-of-lock signal in a first state, said gating circuit being otherwise operative to generate said gated out-of-lock signal in a second state indicative of a condition wherein said phase-locked loop circuit is phase locked within said predetermined phase error; and a switched capacitor circuit responsive to said gated out-of-lock signal for detecting when said gated out-of-lock signal has been in said second state for a predetermined number of cycles of said input clock and generating in response thereto a logical lock signal, said input clock corresponding to said input reference signal.

14. The apparatus of claim 13 wherein said window signal generator includes:

a first delay line coupled to said input clock for generating said input reference signal wherein said input clock is advanced relative to said input reference signal;

a second delay line coupled to said input reference signal for generating an output clock wherein said output clock is retarded relative to said input reference signal; and, an OR gate responsive to said input clock and said output clock for generating said window signal.

15. The apparatus of claim 14 wherein said first delay line introduces a first amount of delay, said second delay line introduces a second amount of delay, said first and second amounts of delay being adjustable to thereby vary said predetermined phase error.

16. The apparatus of claim 13 wherein said out-of-lock detector comprises an OR gate responsive to an UP signal and a DOWN signal generated by the phase-locked loop circuit.

17. The apparatus of claim 13 wherein said gating circuit includes an AND gate responsive to said window signal and said actual out-of-lock signal for generating said gated out-of-lock signal.

18. The apparatus of claim 13 wherein said switched capacitor circuit comprises:

a first capacitor having a first capacitance;

a first switch responsive to said input clock for charging said first capacitor during a first state of said input clock;

a second capacitor having a second capacitance connected between an output node and a negative power supply bus;

a second switch responsive to said input clock for connecting said first capacitor to said output node during a second state of said input clock to thereby permit charging of said second capacitor;

a third switch coupled to said gating circuit and further in parallel with said second capacitor for selectively discharging said second capacitor when said gated out-of-lock signal is in said first state; and, a buffer coupled to said output node for generating said logical lock signal when a voltage potential on said second capacitor reaches a predetermined trip point, said predetermined number of cycles being determined as a function of said first capacitance, said second capacitance, and said predetermined trip point.

19. An apparatus for detecting when an output signal of a phase-locked loop circuit is phase locked to an input reference signal to the phase-locked loop circuit, comprising:

a window signal generator responsive to an input clock for generating a window signal having a pulsewidth indicative of a predetermined phase error to thereby define an acceptable phase error window;

an out-of-lock detector coupled to the phase-locked loop circuit for generating an actual out-of-lock signal representative of whether the output signal of the phase-locked loop circuit is locked with respect to the input reference signal;

an AND gate responsive to said actual out-of-lock signal and said window signal for detecting when said actual out-of-lock signal occurs outside of said acceptable phase error window and generating in response thereto a gated out-of-lock signal in a first state, said gating circuit being otherwise operative to generate said gated out-of-lock signal in a second state indicative of a condition wherein said phase-locked loop circuit is phase locked within said predetermined phase error; and a switched capacitor circuit responsive to said gated out-of-lock signal for detecting when said gated out-of-lock signal has been in said second state for a predetermined number of cycles of said input clock and generating in response thereto a logical lock signal, said input clock corresponding to said input reference signal, said switched capacitor circuit including a first capacitor having a first capacitance;

a first switch responsive to said input clock for charging said first capacitor during a first state of said input clock;

a second capacitor having a second capacitance connected between an output node and a negative power supply bus;

a second switch responsive to said input clock for connecting said first capacitor to said output node during a second state of said input clock to thereby permit charging of said second capacitor;

a third switch coupled to said gating circuit and further in parallel with said second capacitor for selectively discharging said second capacitor when said gated out-of-lock signal is in said first state; and, a buffer coupled to said output node for generating said logical lock signal when a voltage potential on said second capacitor reaches a predetermined trip point, said predetermined number of cycles being determined as a function of said first capacitance, said second capacitance, and said predetermined trip point.

20. A phase-locked loop circuit for generating an output signal in lock with an input reference signal and having an adjustable phase lock window, comprising:

a phase/frequency detector responsive to the input reference signal and the output signal for generating a plurality of out-of-lock indicative signals corresponding to whether said output signal is phase locked with said input reference;

a charge pump responsive to said out-of-lock indicative signals for generating a control signal;

a loop filter coupled to said charge pump for amplifying said control signal;

an oscillator controlled in accordance with said amplified control signal for generating said output signal; and, a lock detector responsive to said plurality of out-of-lock indicative signals for generating a logical lock signal corresponding to a steady-state lock condition of said phase-locked loop circuit, said lock detector including:

means for generating a window signal having a pulse width indicative of a predetermined phase error to thereby define an acceptable phase error window;

means responsive to said out-of-lock indicative signals for detecting when an actual out-of-lock signal occurs outside of said acceptable phase error window and generating in response thereto a gated out-of-lock signal in a first state, said detecting and generating means being otherwise operative to generate said gated out-of-lock signal in a second state indicating that said phase-locked loop circuit is phase locked within said predetermined phase error; and means for detecting when said gated out-of-lock signal has been in said second state for a predetermined number of input clock cycles and generating in response thereto said logical lock signal, said input clock corresponding to said input reference signal.

* * * * *